(12) United States Patent
Zhang et al.

(10) Patent No.: US 8,324,798 B2
(45) Date of Patent: Dec. 4, 2012

(54) LIGHT EMITTING DEVICE USING ORANGE-RED PHOSPHOR WITH CO-DOPANTS

(75) Inventors: Bin Zhang, San Diego, CA (US);
Rajesh Mukherjee, Irvine, CA (US);
Toshitaka Nakamura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 36 days.

(21) Appl. No.: 13/049,452

(22) Filed: Mar. 16, 2011

(65) Prior Publication Data

US 2011/0227476 A1 Sep. 22, 2011

Related U.S. Application Data

(60) Provisional application No. 61/315,606, filed on Mar. 19, 2010.

(51) Int. Cl.
*H05B 33/00* (2006.01)
(52) U.S. Cl. .......................... 313/503; 313/512; 313/487
(58) Field of Classification Search ........................ None
See application file for complete search history.

(56) References Cited

U.S. PATENT DOCUMENTS

| | | | |
|---|---|---|---|
| 5,998,925 A | 12/1999 | Shimizu et al. | |
| 6,069,440 A | 5/2000 | Shimizu et al. | |
| 6,670,748 B2 * | 12/2003 | Ellens et al. | 313/503 |
| 7,094,362 B2 | 8/2006 | Setlur et al. | |
| 7,361,938 B2 | 4/2008 | Mueller et al. | |
| 7,514,721 B2 | 4/2009 | Krames et al. | |
| 2005/0230689 A1 * | 10/2005 | Setlur et al. | 257/79 |
| 2009/0108507 A1 | 4/2009 | Messing et al. | |
| 2009/0212697 A1 | 8/2009 | Nakamura et al. | |
| 2009/0293675 A1 | 12/2009 | Mukherjee et al. | |
| 2010/0012478 A1 | 1/2010 | Nakamura et al. | |
| 2010/0200874 A1 * | 8/2010 | Shioi et al. | 257/91 |

OTHER PUBLICATIONS

Cheng, G., et al., "Pure white hybrid light-emitting device with color rendering index higher than 90,"Opt. Lett. 35, 616-618 (2010).

Jang, Ho S., et al., "Enhancement of red spectral emission intensity of Y3Al5O12:Ce3+ phosphor via Pr co-doping and Tb substitution for the application to white LEDs", Journal of Luminescence, 126 (2007) 371-377.

Pan, Yuexiao, et al., "Tailored photoluminescence of YAG:Ce phosphor through various methods", Journal of Physics and Chemistry of Solids, 65, (2004), 845-850.

(Continued)

*Primary Examiner* — Ashok Patel
(74) *Attorney, Agent, or Firm* — Knobbe, Martens, Olson & Bear, LLP

(57) ABSTRACT

Disclosed herein are lighting apparatuses having a light source, a first phosphor, and a second phosphor, wherein the lighting apparatuses exhibit increased R9 values. In some embodiments, the light source is configured to emit radiation having a wavelength of peak emission between about 495 nm and about 500 nm. The first phosphor may have a first wavelength of peak emission between about 495 nm and about 600 nm. The second phosphor may be represented by the formula $RE_{2-x-y}CaMg_2Si_3O_{12}:Ce_x,A_y$. In an embodiment, RE is a rare earth metal; A is a co-dopant, x is greater than 0 and less than about 1.0; and y is greater than 0 and less than about 0.2. Also disclosed are phosphor compositions including the first phosphor and the second phosphor, and methods of using the same.

19 Claims, 6 Drawing Sheets

OTHER PUBLICATIONS

Reinen, "Die Lichtabsorption des Co2+ und Ni2+ in oxidischen Festkorpern mit Granatstruktur. I", Zeitschrift fur anorganische und allgemeine Chemie, 327 (1964), 238-252.

Setlur, Anant A., et al., "Crystal chemistry and luminescence of Ce-doped LuCaMg(Si, Ge)O and its use in LED based lighting", Chemistry of Materials, 18 (2006), 3314-3322.

Wang, W. et al., "Energy transfer and enriched emission spectrum in Cr and Ce co-doped Y3Al5O12 yellow phosphors," Chemical Physics Letters vol. 457, pp. 103-105 (2008).

Yang, Heesun, et al., "Spectral variations of nano-sized $Y_3Al_5O_{12}$:Ce phosphors via codoping/substitution and their white LED characteristics", Materials Chemistry and Physics, 114 (2009) 665-669.

* cited by examiner

LIGHT EMITTING DEVICE USING ORANGE-RED PHOSPHOR WITH CO-DOPANTS

CROSS-REFERENCE TO RELATED APPLICATIONS

The present application claims the benefit of priority to U.S. Application No. 61/315,606, filed Mar. 19, 2010, which is hereby incorporated by reference in its entirety.

BACKGROUND

1. Field

The present application relates to lighting devices including an orange-red phosphor with co-dopants. The present application also relates to phosphor compositions including an orange-red phosphor with co-dopants and methods of using the same.

2. Description

Solid state light emitting devices, such as light emitting diode (LED), organic light emitting diode (OLED) or sometimes called organic electroluminescent device (OEL), and inorganic electroluminescent device (IEL), are widely utilized for various applications such as flat panel displays, indicator for various instruments, signboards, and ornamental illumination etc. Improving the efficiency of these light emitting devices, especially LED, may provide higher luminescence intensities suitable for general purpose lighting, which replaces current fluorescent and incandescent lamps. A white-LED, especially with a high color rendering index (CRI) and low correlated color temperature (CCT), shows promise as a replacement for existing general purpose lighting devices.

Conventionally, white-LED includes the combination of blue-LED and yellow light emitting YAG phosphor powder dispersed in an encapsulating resin, such as an epoxy or silicone (see e.g, U.S. Pat. Nos. 5,998,925 and 6,069,440). However, this YAG:Ce type LED system exhibits low CRI due to the lack of red luminescence. Accordingly, new red phosphors have been proposed to improve the red luminescence, but most of these red phosphors exhibit poor absorption when excited by traditional blue LED light sources. Meanwhile, red phosphors exhibiting blue excitation face a variety of problems. For example, the synthesis of many blue-excitable red phosphors is expensive because it requires high pressures and/or special ambient controls. Also, many blue-excitable red phosphors degrade when exposed to moisture or increased temperatures. Thus, the production of red phosphors remains a major challenge.

For a warm white LED study, the deep-red color rendering R9 is particularly useful for identifying the emission strength in the deep red region. In the field of solid-state lighting, R9 is an important challenge, and any level of improvement on R9 has an impact on warm light study and application (G. Cheng, M. Mazzeo, S. D'Agostino, F. Della Sala, S. Carallo, and G. Gigli, "Pure white hybrid light-emitting device with color rendering index higher than 90," Opt. Lett. 35, 616-618 (2010)).

SUMMARY

Some embodiments include a lighting apparatus comprising a light source configured to emit radiation having a wavelength of peak emission between about 360 nm and about 500 nm; a first phosphor configured to receive at least a portion of the radiation emitted by the light source, wherein the first phosphor has a first wavelength of peak emission between about 495 nm and about 600 nm; and a second phosphor configured to receive at least a portion of the radiation emitted by the light source, wherein the second phosphor is represented by the formula $RE_{2-x-y}CaMg_2Si_3O_{12}:Ce_x,A_y$, wherein: RE is a rare earth metal element selected from the group consisting of Lu, Y, Sc and Tb; A is a co-dopant selected from the group consisting of Pr, Cr, Mn and Tb; x is greater than 0 and less than about 1.0; and y is greater than 0 and less than about 0.2.

Some embodiments include a phosphor composition comprising a first phosphor having a first wavelength of peak emission between about 495 nm to about 600 nm; and a second phosphor having two emission peaks at (1) a second wavelength of peak emission between about 575 nm and about 680 nm and (2) a third wavelength of peak emission between about 600 nm and about 900 nm; wherein the second phosphor is represented by the formula $RE_{2-x-y}CaMg_2Si_3O_{12}:Ce_x,A_y$, wherein: RE is a rare earth metal element selected from the group consisting of Lu, Y, Sc and Tb; A is a co-dopant selected from the group consisting of Pr, Cr, Mn, and Tb; x is greater than 0 and less than about 1.0; and y is greater than 0 and less than about 0.2.

In some embodiments, a method comprises exposing said phosphor composition to radiation having a wavelength of peak emission between about 360 nm and about 500 nm. In some embodiments, a method comprises exposing said phosphor composition to radiation having a wavelength of peak emission between about 450 nm and about 500 nm.

Some embodiments include a method for enhancing the red emission of a lighting apparatus comprising providing a light source configured to emit radiation having a wavelength of peak emission between about 360 nm and about 500 nm; positioning a first phosphor to receive at least a portion of the radiation emitted by the light source, wherein the first phosphor has a first wavelength of peak emission between about 495 nm and about 600 nm; and positioning a second phosphor to receive at least a portion of the radiation emitted by the light source, wherein the second phosphor is represented by the formula $RE_{2-x-y}CaMg_2Si_3O_{12}:Ce_x,A_y$, wherein: RE is a rare earth metal element selected from the group consisting of Lu, Y, Sc and Tb; A is a co-dopant selected from the group consisting of Pr, Cr, Mn and Tb; x is greater than 0 and less than about 1.0; and y is greater than 0 and less than about 0.2.

DETAILED DESCRIPTION

Lighting Apparatuses

Figure 1:
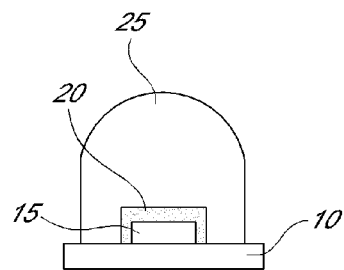
FIG. 1 is an exemplary lighting apparatus having a phosphor powder composition.

Disclosed herein are lighting apparatuses that include a light source, a first phosphor, and a second phosphor. The light source can be configured to emit radiation having a wavelength of peak emission between about 360 nm and about 500 nm. The first phosphor can be configured to receive at least a portion of the radiation emitted by the light source, where the first phosphor has a first wavelength of peak emission between about 495 nm and about 600 nm. The second phosphor can be configured to receive at least a portion of the radiation emitted by the light source, where the second phosphor is represented by the formula $RE_{2-x-y}CaMg_2Si_3O_{12}:Ce_x, A_y$, where RE is a rare earth metal element selected from Lu, Y, Sc and Tb; A is a co-dopant selected from Pr, Cr, Mn and Tb; x is greater than 0 and less than about 1.0; and y is greater than 0 and less than about 0.2. In some embodiments, the co-dopant A is Pr. In some embodiments, the second phosphor has two emission peaks, a second wavelength of peak emission and a third wavelength of peak emission.

The light source may, in some embodiments, be configured to emit radiation having a wavelength of peak emission between about 360 nm and about 500 nm. In another embodiment, the light source emits radiation having a wavelength of peak emission between about 450 nm and about 500 nm. Some embodiments include a light source that is a semiconductor LED. As an example, the light source may be an AlInGaN based single crystal semiconductor material coupled to an electric source.

The first phosphor may be selected to adjust the emitted light from the lighting apparatus. For example, the first phosphor can be selected to emit yellow or green light when exposed to a light source. In some embodiments, the first phosphor has a first wavelength of peak emission between about 495 nm to about 600 nm. For example, the first wavelength of peak emission may be between about 495 nm to about 560 nm, or alternatively the first wavelength of peak emission may be between about 560 to about 590. In some embodiments, the first phosphor has a first wavelength of peak emission between about 495 nm to about 570 nm. In some embodiments, the first phosphor has two emission peaks: a fourth wavelength of peak emission and a fifth wavelength of peak emission. The fourth wavelength of peak emission may be between about 560 nm and about 590 nm. In some embodiments, the fourth wavelength of peak emission may be between about 540 nm and about 560 nm. The fifth wavelength of peak emission may be between about 495 nm and about 560 nm. In some embodiments, the fifth wavelength of peak emission may be between about 495 nm and about 535 nm. In some embodiments, the fourth wavelength of peak emission and the fifth wavelength of peak emission are substantially different (e.g., the peak wavelengths are at least about 10 nm apart).

In some embodiments, the first phosphor includes a metal oxide. In some embodiments, the first phosphor is a garnet. The garnet may have a composition $D_3E_5O_{12}$. In some embodiments, D and E are independently selected from trivalent metals. In some embodiments, D can be selected from Lu, Y, Gd, La, and Tb; and E can be selected from Al, Ga, and In. In a preferred embodiment, D is selected from Lu and Y; and E is Al.

The first phosphor may be doped with at least one rare earth metal. In some embodiments, the first phosphor is doped with a dopant selected from Ce, Gd, La, Tb, Pr and Eu. Exemplary first phosphors include, but are not limited to, $Y_3Al_5O_{12}:Ce$, $(Y, Tb)_3Al_5O_{12}:Ce$, $(Y, Gd)_3(Al, Ga)_5O_{12}:Ce$, $Lu_3Al_5O_{12}:Ce$, $(Sr, Ca, Ba)_2SiO_4:Eu$, $Ca_3Sc_2Si_3O_{12}:Ce$, $SrGa_2S_4:Eu$, and $CaSiAlON:Eu$. In some embodiments, the first phosphor can be $Y_{3-z}Al_5O_{12}:Ce_z$, where z is in the range of about 0.01 to about 0.30. In other embodiments, the first phosphor can be $Lu_{3-z}Al_5O_{12}:Ce_z$, where z is in the range of about 0.01 to about 0.30.

The second phosphor may be a co-doped phosphor. In some embodiments, the second phosphor is a co-doped silicate phosphor and can be represented by the formula $RE_{2-x-y}CaMg_2Si_3O_{12}:Ce_x,A_y$, where: RE is a rare earth metal selected from Lu, Y, Sc, and Tb; A is a co-dopant selected from Pr, Sm, Eu, Cr, Mn, Tb, and La; x is greater than 0 and less than about 1.0; and y is greater than 0 and less than about 0.2. In some embodiments, A is selected from Pr, Cr, Mn and Tb. In some embodiments, RE is Lu. In some embodiments, A is Pr. In some embodiments, x is in the range of about 0.002 to about 1.0; and y is in the range of about 0.005 to about 0.20.

Exemplary second phosphors include, but are not limited to, $Lu_{2-x-y}CaMg_2Si_3O_{12}:Ce_x,Pr_y$, $Lu_{2-x-y}CaMg_2Si_3O_{12}:Ce_x,Cr_y$, $Lu_{2-x-y}CaMg_2Si_3O_{12}:Ce_x,Mn_y$, $Lu_{2-x-y}CaMg_2Si_3O_{12}:Ce_x,Tb_y$, $Y_{2-x-y}CaMg_2Si_3O_{12}:Ce_x,Pr_y$, $Y_{2-x-y}CaMg_2Si_3O_{12}:Ce_x,Cr_y$, $Y_{2-x-y}CaMg_2Si_3O_{12}:Ce_x,Mn_y$, $Y_{2-x-y}CaMg_2Si_3O_{12}:Ce_x,Tb_y$, $Sc_{2-x-y}CaMg_2Si_3O_{12}:Ce_x,Pr_y$, $Sc_{2-x-y}CaMg_2Si_3O_{12}:Ce_x,Cr_y$, $Sc_{2-x-y}CaMg_2Si_3O_{12}:Ce_x,Mn_y$, $Sc_{2-x-y}CaMg_2Si_3O_{12}:Ce_x,Tb_y$, $Tb_{2-x-y}CaMg_2Si_3O_{12}:Ce_x,Pr_y$, $Tb_{2-x-y}CaMg_2Si_3O_{12}:Ce_x,Cr_y$, $Tb_{2-x-y}CaMg_2Si_3O_{12}:Ce_x,Mn_y$, $Tb_{2-x-y}CaMg_2Si_3O_{12}:Ce_x,Tb_y$. In an embodiment, x is in the range of about 0.002 to about 1.0, and y is in the range of about 0.005 to about 0.20. In another embodiment, x is about 0.12 and y is about 0.03. In some embodiments, the second phosphor is $Lu_{2-x-y}CaMg_2Si_3O_{12}:Ce_x,Pr_y$, where x is greater than 0 and less than about 0.50 and y is greater than 0 and less than about 0.20. In some embodiments, the second phosphor is $Lu_{1.78-1.935}CaMg_2Si_3O_{12}:Ce_{0.002-0.020}, Pr_{0.005-0.015}$. In some preferred embodiments, the second phosphor is $Lu_{2-x-y}CaMg_2Si_3O_{12}:Ce_x,Pr_y$, where x is about 0.12 and y is about 0.03.

Applicants have surprisingly found that the co-doped silicate phosphors described above can exhibit two emission peaks: a second wavelength of peak emission and a third wavelength of peak emission, both peaks being near the color red. Thus, unlike a co-doped Ce and Eu host, multiple peak emissions, were found. Consequently, a person of ordinary skill, guided by the teachings of the present application, can select an appropriate co-doped silicate phosphor to increase the red luminescence of a white-LED, which in turn can increase the CRI (Color Rendering Index).

In some embodiments, the second wavelength of peak emission is between about 575 nm and about 680 nm. The second wavelength of peak emission may, in some embodiments, be a broad peak (e.g., have a full width at half maximum (FWHM) of at least about 60 nm). In some embodiments, the third wavelength of peak emission is between about 600 nm to about 900 nm. For example, the third wavelength of peak emission can be between about 600 nm and about 640 nm, or alternatively between about 700 nm and about 900 nm. The third wavelength of peak emission may, in some embodiments, be a narrow peak (e.g., have a FWHM of no more than about 40 nm). In some embodiments, the second wavelength of peak emission and the third wavelength of peak emission can be substantially different (e.g., the two wavelengths are at least 10 nm apart). Also, the second wavelength of peak emission may be substantially different than any wavelength of peak emission for the first phosphor (e.g., first, fourth and/or fifth wavelengths of peak emission).

By selecting an appropriate co-dopant in conjunction with appropriate first and second phosphors, the lighting apparatus can exhibit a CRI of at least 70 when exposed to light. In other embodiments, the CRI is at least 72; at least 75; or at least 80. The reference correlated color temperature (CCT) for the CRI may be in the range of 2000 K to about 4000K; in the range of about 2500 K to about 3500 K; or about 2600 to about 3400 K.

In some embodiments, the addition of co-dopant increases the R9 value (standardize strong red color, see Commission International de l'Eclairage {CIE} 1995) of emitted light from the lighting apparatus. In some embodiments, the lighting apparatus can exhibit an increased R9 value of at least about 5%, at least about 7%, or at least about 10% as compared to a reference lighting apparatus without co-doped phosphors. CRI is the average of the first eight rendering indices.

In some embodiments, a third phosphor may be included in the lighting apparatus. The third phosphor can be included in an emissive layer. In some embodiments, the third phosphor may be present in the encapsulated powder. In some embodiments, the third phosphor is configured to emit green light (e.g., have a wavelength of peak emission in the range of about 495 nm to about 560 nm), and the first phosphor is configured to emit yellow light (e.g., have a wavelength of peak emission in the range of about 560 nm to about 590 nm). In another embodiment, the first phosphor is configured to emit green light, and the third phosphor is configured to emit yellow light. In still another embodiment, the first phosphor, the second phosphor, and the third phosphor are present in separate ceramic plates. The lighting apparatus may also include one or more non-emissive layers. In an embodiment, at least one non-emissive layer is interposed between two emissive layers.

The location of the various components (e.g., the lights source, first phosphor, etc.) in the lighting apparatus is not particularly limited. In some embodiments, the components are configured so that both the first phosphor and the second phosphor receive at a least a portion of the radiation emitted from the light source. Light emitted from the first phosphor may be reabsorbed by the second phosphor, which can diminish the efficiency and/or CRI of the lighting apparatus. Thus, the first phosphor and the second phosphor may be configured to reduce emitted light from the first phosphor being absorbed by the second phosphor. In some embodiments, the second phosphor is disposed at least partially between the light source and the first phosphor.

Various configurations for the lighting apparatus are within the scope of the present application. FIGS. 1-2 (not drawn to scale) provide non-limiting examples of lighting apparatuses within the scope of the present application. FIG. 1 is an exemplary lighting apparatus having a phosphor powder composition. A submount 10 has a light source 15, such as a conventional base LED mounted thereon. The light source 15 is adjacent to encapsulated phosphor powder 20 which receives at least a portion of the light emitted from the light source 15. An optional encapsulant resin 25 is placed over the light source 15 and the encapsulated phosphor powder 20. In some embodiments, the encapsulated phosphor powder 20 includes two or more phosphors. For example, the encapsulated phosphor powder 20 can include the first phosphor and the second phosphor. In an embodiment, the two or more phosphors are interdispersed in the encapsulated phosphor powder 20. In another embodiment, the first phosphor and the second phosphor are disposed in different regions of the lighting apparatus (e.g., the second phosphor powder is positioned adjacent to the lighting apparatus, while the first phosphor powder is positioned above the second phosphor powder).

The phosphor compositions may be encapsulated in a mold (e.g., as illustrated by encapsulated phosphor powder 20). For example, the composition may be formed into a mold by encapsulating the first phosphor and the second phosphor in a resin, such as an epoxy or silicone. Examples and methods for encapsulating the phosphors are disclosed in U.S. Pat. Nos. 5,998,925 and 6,069,440, both of which are hereby incorporated by reference in their entirety. Briefly, a powder form of the first phosphor and the second phosphor may be intermixed with a resin to form a slurry. The slurry may then be cured to form the mold.

In some embodiments, the first phosphor and the second phosphor may be intermixed before disposing within the lighting apparatus. For example, a mixture of the first phosphor and the second phosphor may be prepared and subsequently encapsulated within a resin. In some embodiments, the first phosphor and second phosphor are encapsulated in separate portions of the lighting apparatus without substantial intermixing.

Figure 2A:
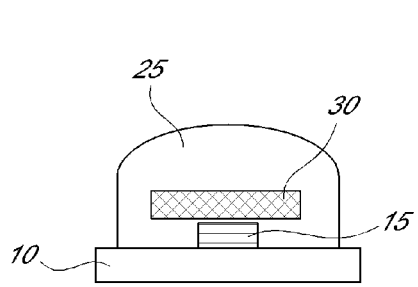
FIGS. 2A-D include exemplary lighting apparatuses having phosphors contained within an emissive layer.

FIG. 2A is another exemplary lighting apparatus where the phosphors are contained within an emissive layer 30 which receives at least a portion of the light emitted from the light source 15. In an embodiment, the emissive layer 30 includes two or more phosphors. For example, the emissive layer 30 may comprise the first phosphor and the second phosphor.

Figure 2B:
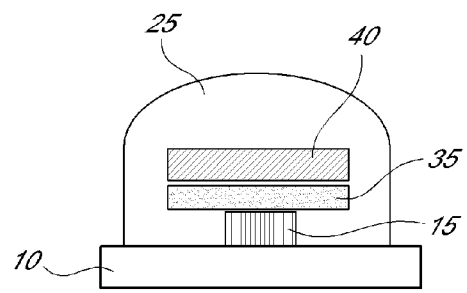

FIG. 2B is still another exemplary lighting apparatus where the phosphors are contained within separates emissive layers. The first emissive layer 40 is disposed above light source 15 and receives at least a portion of the light emitted from the light source 15. The second emissive layer 35 is disposed between the first emissive layer 40 and the light source 15. The second emissive layer 35 also receives at least a portion of the light emitted from the light source 15. In some embodiments, the first emissive layer 40 comprises the first phosphor and the second emissive layer 35 comprises the second phosphor.

Figure 2C:
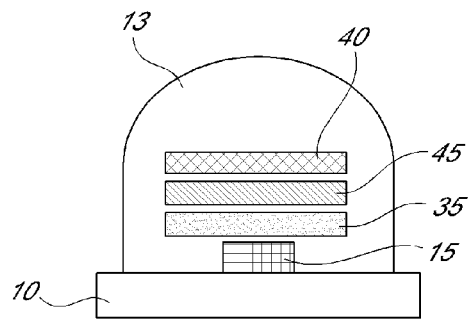

In some embodiments, the light apparatus may comprise three or more layers of emissive and non-emissive layers. FIG. 2C is an exemplary lighting apparatus having three layers. Layer 45 is interposed between the first emissive layer 40 and the second emissive layer 35. In some embodiments, layer 45 is a non-emissive layer. In some embodiments, layer 45 is an emissive layer. In some embodiments, the second emissive layer 35 comprises the second phosphor and the first emissive layer 40 comprises the first phosphor. In some embodiments, layer 45 is a non-doped ceramic.

Figure 2D:
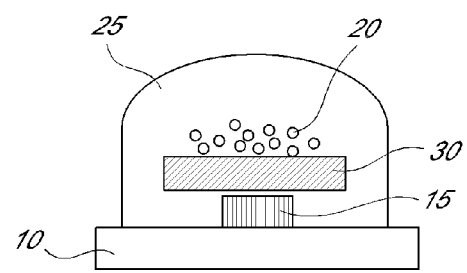

FIG. 2D is an exemplary lighting apparatus that includes a plurality of an encapsulated phosphor powder 20 disposed over an emissive layer 30 so that the emissive layer 30 is between the plurality of the encapsulated phosphor powder 20 and the light source 15. In some embodiments, the emissive layer 30 includes the second phosphor. In some embodiments, the encapsulated phosphor powder 20 includes the first phosphor.

Luminescent Phosphor Powders

Luminescent powders of the first phosphor and the second phosphor may be prepared by conventional means, such as flow-based thermochemical synthetic routes (e.g., laser pyrolysis, flame spray, spray pyrolysis and plasma synthesis). As an example, radio frequency inductively coupled thermal plasma synthesis includes atomizing an aqueous solution having stoichiometric amounts of nitrate based raw materials, and then using a radio frequency plasma torch to evaporate and decompose the precursor materials. These materials nucleate into particles, which may be isolated (e.g., using an appropriate filter), and annealed (e.g., in a furnace at 1000° C. or more) to convert material to the desired phosphor. Methods for producing nanoparticles using a radio frequency plasma torch are disclosed in U.S. application Ser. No. 12/175,389, entitled "Thermal Treatment for Inorganic Materials," and U.S. application Ser. No. 12/131,844, entitled "Method and Apparatus of Producing Nanoparticles using Nebulized Droplet," both of which are hereby incorporated by reference in their entireties.

The prepared phosphor may be granulated or formed into powders via comminution, such as using a mortar and pestle, ball milling machine, bead milling machine or other suitable methods. The first phosphor and/or second phosphor may each be formed, independently, into a powder having an average particle size of, for example, less than about 10 µm; less than about 200 nm; less than about 500 nm; or less than about 1000 nm in diameter.

Ceramic Plates

The lighting apparatus can include one or more emissive layers having the first phosphor and/or the second phosphor (e.g., as illustrated in FIGS. 2A-D). The emissive layer(s) may, in some embodiments, be one or more ceramic plates. In some embodiments, the lighting apparatus includes at least one ceramic plate. In some embodiments, the at least one ceramic plate independently includes an emissive material having about 85% to about 99.99% by volume (e.g., the first and/or second phosphor) and about 15% to about 0.01% by volume of a non-emissive material. In some embodiments, the lighting apparatus may include a first ceramic plate having at least 85% by volume of the first phosphor, and a second ceramic plate having at least 85% by volume of the second phosphor. In some embodiments, the lighting apparatus may include a ceramic plate having the total amount of the first phosphor and the second phosphor be at least 85% by volume. The at least one ceramic plates are configured to receive at least a portion of light emitted from a light source.

The ceramic plates may be prepared by molding and sintering phosphor mixtures. Exemplary ceramic plates and methods of make the same are disclosed U.S. Publication No. 2009/0212697, which is hereby incorporated by reference in its entirety. In some embodiments, the ceramics plate may include a multiphase material. In some embodiments, the ceramic plate may comprise the first phosphor and/or the second phosphor. In some embodiments, the ceramic plate has an emissive phase that includes a phosphor selected from the first phosphor and/or the second phosphor, and a non-emissive phase. The ceramic plate including a multiphase material can be made using generally the same methods for making ceramic plates. In some embodiments, the material(s) for forming the non-emissive phase can be introduced by adjusting the ratio of the components of the precursor solution. For example, by increasing the amount of aluminum nitrate nonahydrate in the precursor solution, the nano-powder produced by inductively coupled RF thermal plasma pyrolysis followed by annealing would comprise YAG and $Al_2O_3$. In some embodiments, adjusting the ratio of yttrium and aluminum precursors can yield nano-powders comprising YAG and one or more of the following materials: YAP, YAM, $Y_2O_3$, or $Al_2O_3$.

The lighting apparatus may include non-emissive layers (e.g., embodiments where layer 45 is a non-emissive layer). The non-emissive layer may also be a ceramic plate which is prepared using similar molding and sintering procedure as those described above. A non-emissive layer may be prepared, for example, by sintering and molding a YAG powder that excludes amounts of dopant that are effective to produce fluorescence.

The ceramic plates may also be formed by laminating and sintering two or more cast tapes, where at least a portion of the cast tapes include the first phosphor and/or the second phosphor. Examples and methods of forming the composition by laminating and sintering two or more cast tapes are disclosed in U.S. Pat. No. 7,514,721 and U.S. Publication No. 2009/0108507, both of which are hereby incorporated by reference in their entirety.

Two or more tapes can be laminated to form an assembly. In some embodiments, the assembly includes at least one tape having the first phosphor. In some embodiments, the assembly includes at least one tape having the second phosphor. The arrangement of the stacked tapes is not particularly limited, however the tapes may be stacked so all of the tapes including the first phosphor are stacked together and all of the tapes including the second phosphor are stacked together. The assembly then can be heated to form the ceramic plate. The heating step may also include a sintering process to form a ceramic sheet. The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1900° C. (preferably about 1500° C. to about 1800° C., or more preferably about 1600° C. to about 1700° C.) for a time period in the range of about 1 hr. to about 100 hrs (preferably about 2 hrs. to about 10 hrs.).

The lighting apparatus may include non-emissive layers (e.g., embodiments where layer 45 is a non-emissive layer). The non-emissive layer can be a ceramic plate which may also be prepared using similar laminating and sintering procedures as those described above. A non-emissive ceramic plates may be prepared, for example, by laminating and sintering a YAG powder that excludes amounts of dopant that are effective to produce fluorescence.

Phosphor Compositions

Disclosed herein are phosphor compositions that include a first a phosphor having a first wavelength of peak emission and a second phosphor. The first wavelength of peak emission may be between about 495 nm and about 600 nm. Meanwhile, the second phosphor can be represented by the formula $RE_{2-x-y}CaMg_2Si_3O_{12}:Ce_x,A_y$, where: RE is a rare earth metal selected from Lu, Y, Sc, and Tb; A is a co-dopant selected from Pr, Sm, Eu, Cr, Mn, Tb, and La; x is greater than 0 and less than about 1.0; and y is greater than 0 and less than about 0.2. In some embodiments the rare earth metal is selected from those metals having a second wavelength of peak emission from about 565 nm to about 650 nm. In some embodiments the rare earth metal has 570 nm to about 630 nm. In some embodiments, the second phosphor has two emission peaks, a second wavelength of peak emission and a third wavelength of peak emission.

The phosphor composition may be the phosphor containing components that are described above with respect to the lighting apparatus. Thus, the phosphor composition can include the first phosphor and the second phosphor described above with respected to the lighting apparatus. For example, the phosphor composition may be a powder, such as the encapsulated powder 20 illustrated in FIG. 1. The phosphor composition may also be in the form of a ceramic plate, such as ceramic plate 30 illustrated in FIG. 2A. In some embodiments, the first phosphor and the second phosphor are dispersed within the phosphor composition. In other embodiments, the first phosphor and the second phosphor are included in segregated portions of the phosphor composition. For example, the phosphor composition may be two ceramic plates, where the first ceramic plate includes the first phosphor, and the second ceramic plate includes the second phosphor.

In some embodiments, the phosphor composition includes at least about 1 mg of the first phosphor, about 2 mg, or about 3 mg). In another embodiment, the phosphor composition includes at least about 6.5 mg of the second phosphor, where there is 1 mg of first phosphor (preferably about 13.0 mg, or more preferably about 19.5 mg). In some embodiments, where a warm white light emission (color temperature is less than about 3000K) is preferred, the phosphor composition includes at least about 7.5% of the first phosphor by weight (preferably about 10%, or more preferably 15%). In still other embodiments, the phosphor composition includes at least about 92.5% of the second phosphor by weight (preferably about 90%, or more preferably 85%). In some embodiments, where a cold white light emission (color temperature is greater than about 5000K) is preferred, the phosphor composition includes at least about 50% of the first phosphor by weight (preferably about 60%, or more preferably 70%). In still other embodiments, the phosphor composition includes at least about 50% of the second phosphor by weight (preferably about 40%, or more preferably 30%).

Some embodiments of the phosphor composition can exhibit a CRI of at least 70 when exposed to light. In other embodiments, the CRI is at least 72; at least 75; or at least 80. In an embodiment, the phosphor composition can exhibit at least a particular CRI (e.g. at least 70) when exposed to light having a wavelength of peak emission in the range of about 360 nm to about 500 nm (or preferably about 450 nm to about 500 nm). The reference correlated color temperature for the CRI may be in the range about 2000 K to about 4000K; in the range of about 2500 K to about 3500 K; or about 2600 to about 3400 K.

In some embodiments, the added co-dopant increases the R9 value of the phosphor composition when exposed to light. In some embodiments, the lighting apparatus can exhibit an increased R9 value of at least about 5%, at least about 7%, or at least about 10% as compared to a reference phosphor composition without co-doped phosphors when exposed to light having a wavelength of peak emission in the range of about 360 nm to about 500 nm (or preferably about 450 nm to about 500 nm).

Also disclosed herein are methods of using the phosphor composition. The method may include exposing the phosphor composition to light having a wavelength of peak emission in the range of about 360 nm to about 500 nm (or preferably about 450 to about 500 nm).

Some embodiments provide a method for improving the luminance intensity of a LED. In some embodiments, the first phosphor and the second phosphor, such as those described in the present application, are positioned over a light source, such as a blue LED, to provide white light emission. In some embodiments, the phosphor composition, which includes the first phosphor and the second phosphor, can exhibit a CRI of at least 70 when exposed to radiation from the light source. In some embodiments, the light source emits radiation having a wavelength of peak emission in the range of about 360 nm and about 500 nm (preferably about 450 nm to about 500 nm).

EXAMPLES

Additional embodiments are disclosed in further detail in the following examples, which are not in any way intended to limit the scope of the claims.

Evaluating Luminescence of Phosphor Powders

The luminescence efficiency of phosphor powder was evaluated by measuring the emission from the phosphor powders irradiated by standard excitation light with a predetermined intensity. The internal quantum efficiency (IQE) of a phosphor is the ratio of the number of photons generated from the phosphor to the number of photons of excitation light which penetrate into the phosphor.

The IQE of a phosphor material can be expressed by the following formula:

$$InternalQuantumEfficiency = \frac{\int \lambda \cdot P(\lambda)d\lambda}{\int \lambda \cdot E(\lambda) \cdot [1 - R(\lambda)]d\lambda}$$

$$ExternalQuantumEfficiency(\lambda) =$$

$$InternalQuantumEfficiency(\lambda) \cdot [1 - R(\lambda)]$$

$$Absorption(\lambda) = 1 - R(\lambda)$$

where at any wavelength of interest $\lambda$, $E(\lambda)$ is the number of photons in the excitation spectrum that are incident on the phosphor, $R(\lambda)$ is the number of photons in the spectrum of the reflected excitation light, and $P(\lambda)$ is the number of photons in the emission spectrum of the phosphor. This method of IQE measurement is also provided in Ohkubo et al., "Absolute Fluorescent Quantum Efficiency of NBS Phosphor Standard Samples," 87-93, J. Illum. Eng. Inst. Jpn. Vol. 83, No. 2, 1999, the disclosure of which is incorporated herein by reference in its entirety.

1.0 $Lu_2CaMg_2Si_3O_{12}$ with Single Dopant

The synthesis of 1 g $Lu_2CaMg_2Si_3O_{12}$:Ce (Ce doped at 6 mol %) is described. 0.53 g $Lu_2O_3$, 0.029 g $CeO_2$, 0.141 g $CaCO_3$, 0.113 g MgO (Aldrich, 99.999%), and 0.254 g $SiO_2$ were mixed with about 10 ml of methanol using a mortar and pestle to obtain a very smooth slurry. By blowing hot air from a dryer and moving the pestle, methanol was completely removed to obtain a dry powder. Then, the mixture was transferred into an alumina boat and heated to 600° C. using a furnace in air at a ramp rate of 4° C./min. The dried mixture of powders were annealed in air or a mixture of 3% $H_2$/97% $N_2$ at about 1500° C. for 5 hours, and then cooled to room temperature (RT) under the aforementioned $H_2/N_2$ flow. The particles synthesized in this section had an average particle size of 0.2 to 0.5 μm, and the particles were constituted by $Lu_2CaMg_2Si_3O_{12}$:Ce doped powder with a cerium content of 6.0 mol %. $Lu_2CaMg_2Si_3O_{12}$:Ce was prepared with Ce dopant concentrations ranging from 0.2% to 50% by mole in a similar manner by varying the amount of $CeO_2$ in the mixture, e.g., 0.001 g $CeO_2$ (0.2 mol %), 0.029 g $CeO_2$ (6.0 mol %), 0.098 g $CeO_2$ (20 mol %) and 0.253 g $CeO_2$ (50 mol %).

Figure 3A:
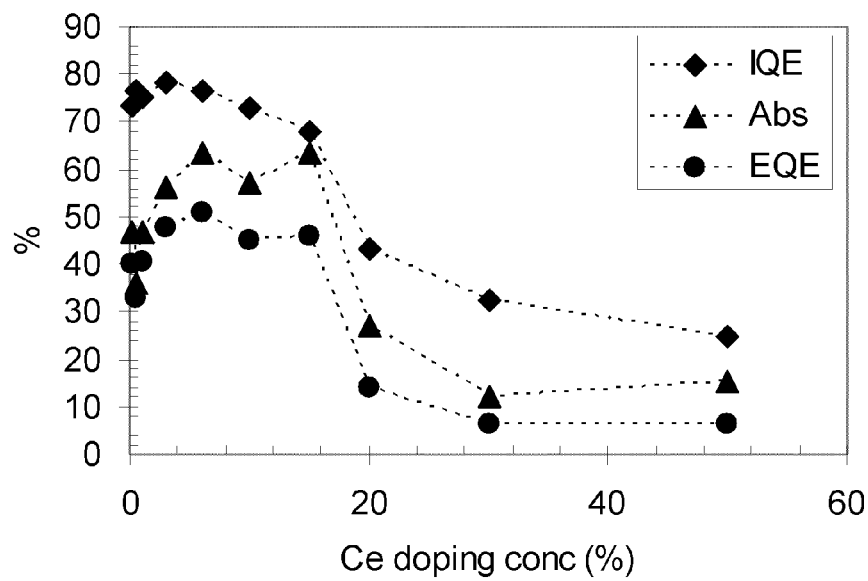
FIG. 3A-B shows the optical performance for $Lu_2CaMg_2Si_3O_{12}:Ce$ at varying dopant concentrations.
Figure 3B:
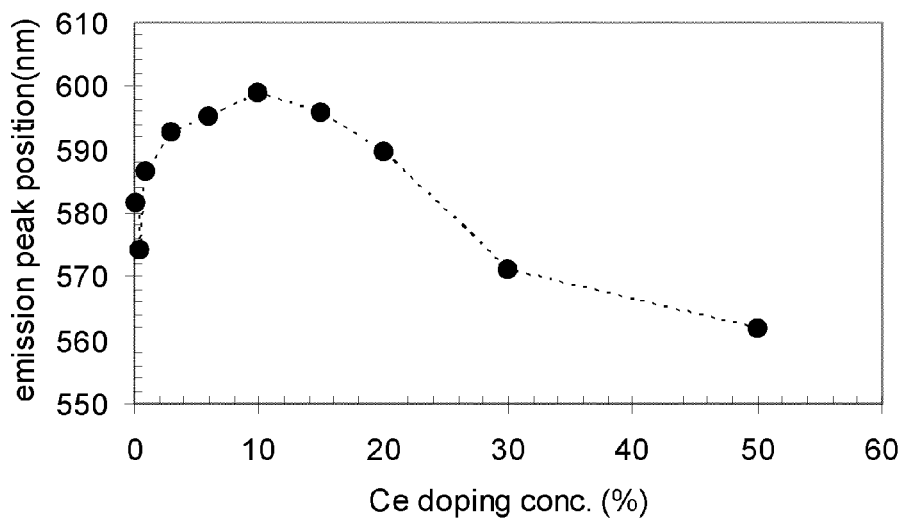

The IQE, absorption (Abs), and External Quantum Efficiency (EQE) for $Lu_2CaMg_2Si_3O_{12}$:Ce prepared various samples with Ce dopant concentrations ranging from 0.2% to 50% by mole are shown in FIG. 3A, and the wavelength of peak emission is shown in FIG. 3B. $Lu_2CaMg_2Si_3O_{12}$:Ce showed better performance with a dopant concentration range of about 6% to about 15%. The phosphor with 6% Ce dopant exhibited an IQE of 77%, absorption (Abs) of 63% and an emission peak at 595 nm. The phosphor with 10% Ce dopant exhibited an IQE of 74%, absorption of 57% and an emission peak at about 600 nm.

2.0 Synthesis Conditions for $Lu_2CaMg_2Si_3O_{12}$ with Single Dopant

Figure 4:
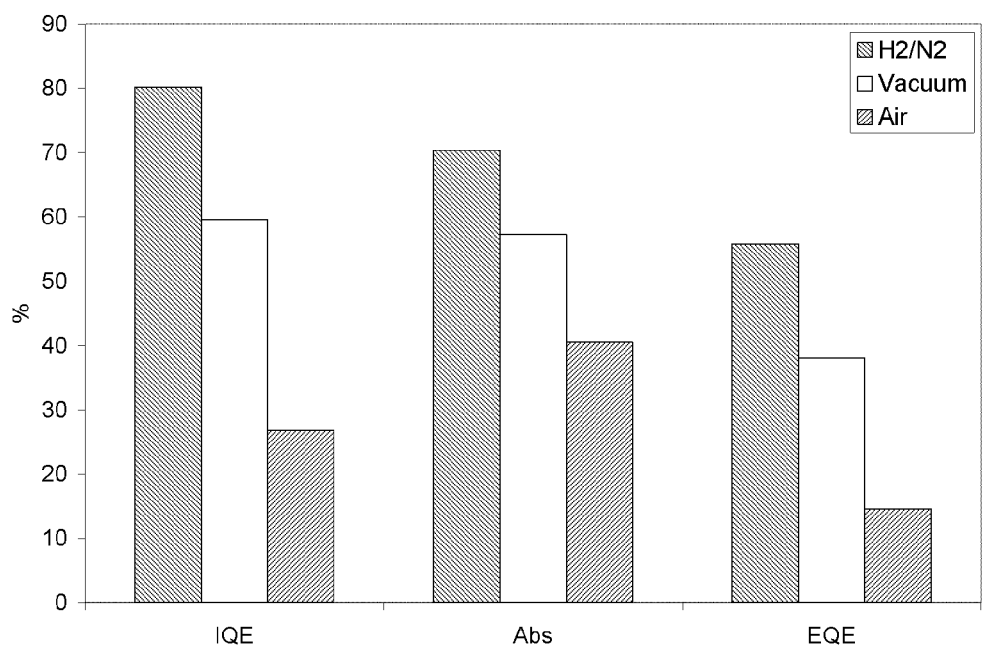
FIG. 4 summarizes the optical performance of $Lu_2CaMg_2Si_3O_{12}:Ce$ samples synthesized under $H_2/N_2$, vacuum and air.

In another example, $Lu_2CaMg_2Si_3O_{12}$:Ce was prepared in a similar manner to that described in Section 1.0, except they were sintered under different atmosphere conditions, at 1400° C. for about 5 hours. FIG. 4 summarizes the optical performance of the samples synthesized under $H_2/N_2$, vacuum and air. $Lu_2CaMg_2Si_3O_{12}$:Ce heated under $H_2/N_2$ showed better emission intensity (e.g., IQE) and absorption, especially when being excited by 455 nm light source.

3.0 Synthesis of $Lu_2CaMg_2Si_3O_{12}$:Ce Ceramic Plates

Sintered ceramic plates were made using 2 g of $Lu_2CaMg_2Si_3O_{12}$:Ce nano-powder prepared by the method described above. The annealed $Lu_2CaMg_2Si_3O_{12}$:Ce phosphor nano-powder (2 g) was added to high purity alumina ball mill jars containing 15 g of $ZrO_2$ balls of 3 mm in diameter. Poly(vinyl butyral-co-vinyl alcohol-co-vinyl acetate) (0.25 g) was added to the ball mill jar together with ethanol (20 ml). The mixture was ball-milled for about 4 hours to produce a slurry, then dried in an agate mortar at 70° C. until the ethanol evaporated completely.

The obtained dry powder was spread out onto a die set with a 3 mm diameter (Product#: 0012-6646, 3 mm KBr Die Set, International Crystal Laboratories, Inc) followed by applying 4000 psi of pressure using a hydraulic press. The obtained plates were sintered at 800° C. for about 2 hours (heating rate was 1° C./min) using a box electrical furnace under an air ambient, then at 1400° C. (heating rate was 1° C./min) in a vacuum using a tube furnace. A sintered ceramic plate sample of $Lu_2CaMg_2Si_3O_{12}$:Ce phosphor, which had a pink color, was prepared using this method. The crystalline phase of all ceramic plate samples was determined as yttrium aluminum garnet by XRD.

Figure 5:
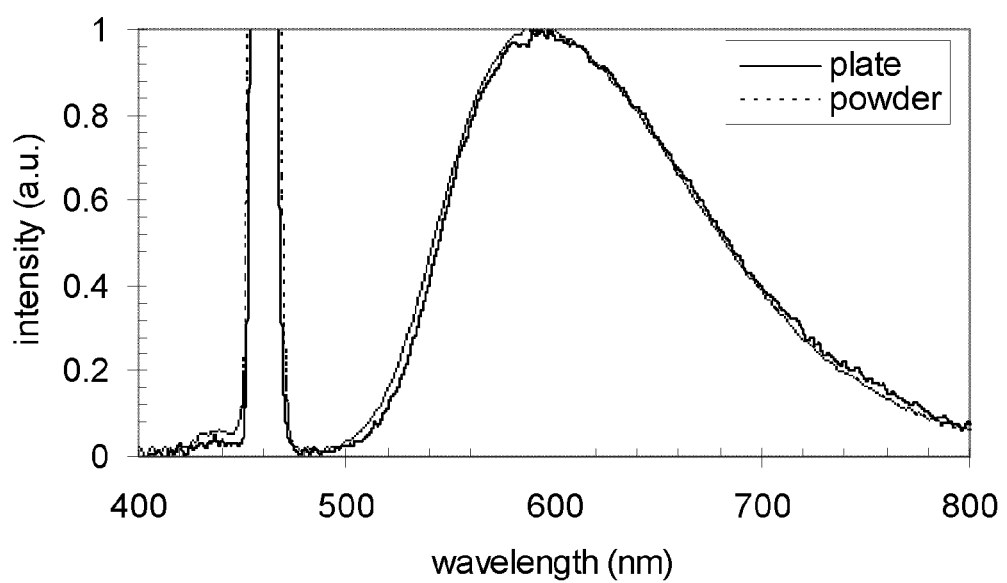
FIG. 5 shows the emission spectra of a ceramic plate with $Lu_2CaMg_2Si_3O_{12}:Ce$ having 6 mol % Ce.

FIG. 5 shows the emission spectra for both a ceramic plate and powder with $Lu_2CaMg_2Si_3O_{12}$:Ce having 6.0 mol % Ce as prepared in Sections 1-3. The emission spectra are substantially the same.

4.0 Synthesis of Co-Doped Phosphor Powder $Lu_2CaMg_2Si_3O_{12}$:Ce having a co-dopant was prepared in the manner as described in Section 3.0 above, except that high-purity lutetium oxide ($Lu_2O_3$, Metal Rare Earth Limited, China, 99.99%), calcium carbonate ($CaCO_3$, Aldrich, 99%), magnesium oxide (MgO, Aldrich, 99.999%), silicon oxide ($SiO_2$, Aldrich, 99%), and cerium oxide ($CeO_2$, Aldrich, 99.995%) were used as raw materials. For the co-dopants of Pr, Eu and Sm, praseodymium nitrate ($Pr(NO_3)_3 \cdot 6H_2O$, Aldrich, 99.99%), europium oxide ($Eu_2O_3$, Aldrich, 99.5%) and samarium nitrate hexhydrate ($Sm(NO_3)_3 \cdot 6H_2O$, Aldrich, 99.9%) were used as raw materials. 1 g of $Lu_2CaMg_2Si_3O_{12}$ having 6 mol % Ce and 0 mol %, 0.5 mol %, or 1.5 mol % Pr was prepared in the manner described in Section 3.0 above, except that 0 mol % (0 g), 0.5 mol % (0.0061 g), or 1.5 mol % (0.0184 g) of $Pr(NO_3)_3 \cdot 6H_2O$ (Aldrich, 99.99%) was added. 1 g of YAG having 1 mol % Ce and 0 mol % or 1 mol % Sm was prepared in a similar manner to Section 3, except that 0 g (0 mol %) and 0.0214 g (1 mol % Sm) of $Sm(NO_3)_3 \cdot 6H_2O$ was also added.

Figure 6A:
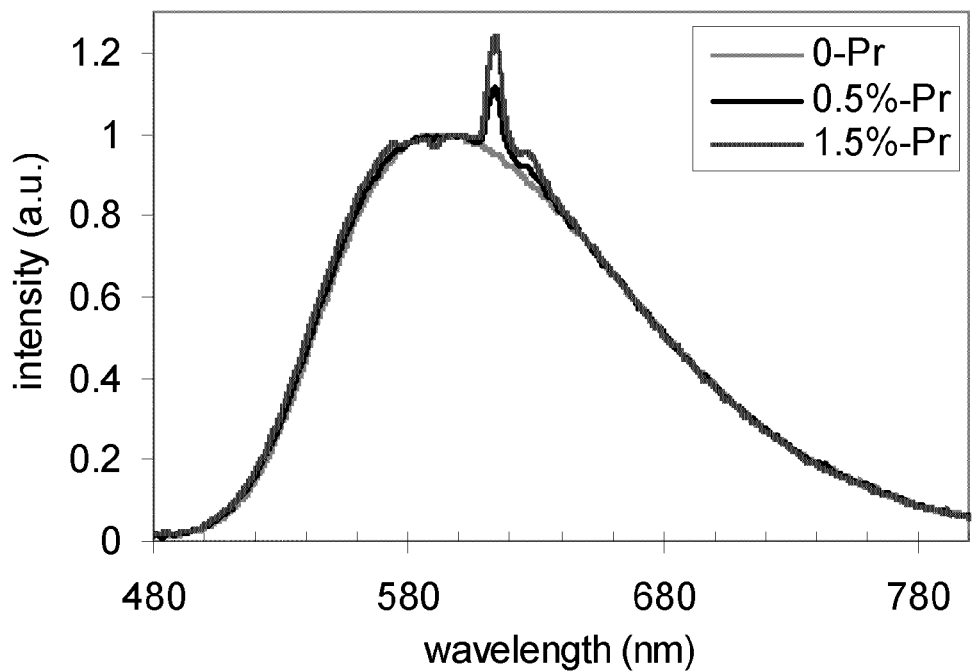
FIG. 6A-B show the optical performance of $Lu_2CaMg_2Si_3O_{12}$ doped with 6 mol % Ce and 0 mol %, 0.5 mol %, and 1.5 mol % Pr.
Figure 6B:
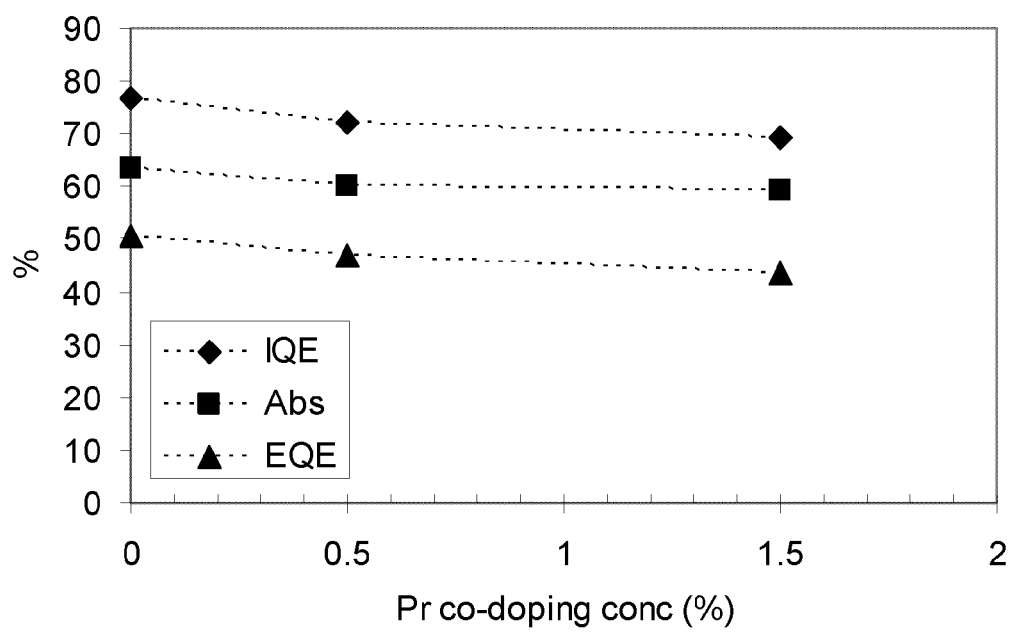
Figure 7:
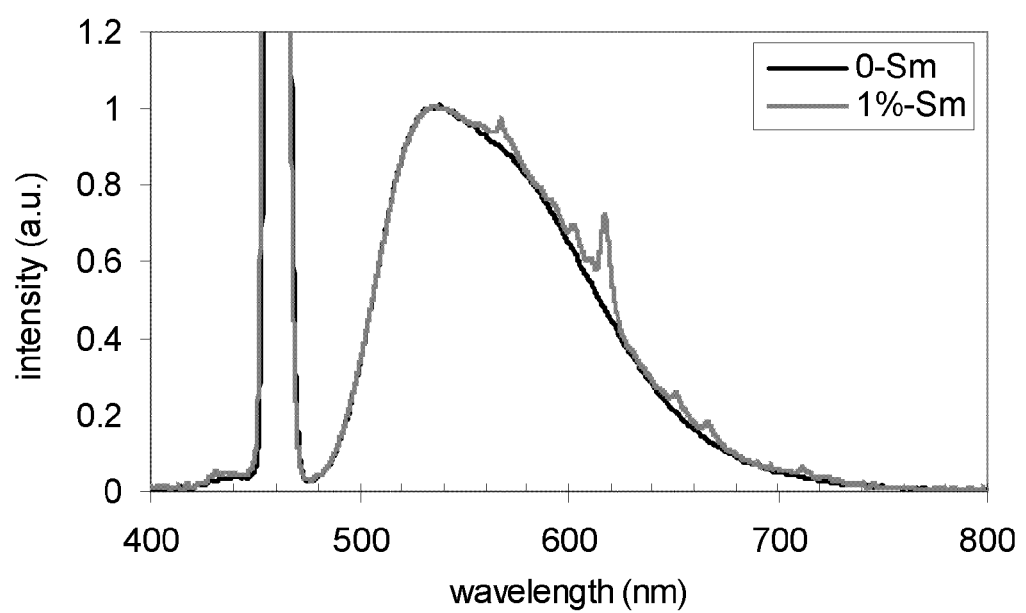
FIG. 7 shows the emission spectra for $Lu_2CaMg_2Si_3O_{12}$ having 1 mol % Ce and 0 mol % or 1 mol % Sm.

FIG. 6A shows the emission spectra for $Lu_2CaMg_2Si_3O_{12}$ having 6% Ce by weight and 0 mol %, 0.5 mol %, or 1.5 mol % Pr. All of the samples exhibit a broad emission peak at about 520 nm, however only samples co-doped with Pr exhibit a narrow emission peak at about 610 nm. FIG. 6B show the IQE, ABS, and EQE for various concentrations of co-dopant. FIG. 7 shows the emission spectra for YAG having 1 mol % Ce and 0 mol % or 1 mol % Sm.

4.0 Light Emission from Co-Doped Phosphor Compositions

The color rendering index (CRI) and R9 value were measured for various phosphor compositions. Powders of YAG with 1.75 mol % Ce, $Lu_2CaMg_2Si_3O_{12}$ with 6.00 mol % Ce and $Lu_2CaMg_2Si_3O_{12}$ with 6.00 mol % Ce and 1.50 mol % Pr co-dopant were prepared using methods generally the same as those disclosed above. The emission of three compositions were tested: (1) YAG; (2) YAG intermixed with $Lu_2CaMg_2Si_3O_{12}$:Ce; and (3) YAG intermixed with $Lu_2CaMg_2Si_3O_{12}$:Ce,Pr.

Optical Measurement

Chromaticity measurements were performed with Otsuka Electronics MCPD 7000 multi channel photo detector system (Otsuka Electronics, Osaka, Japan) together with required optical components, such as optical fibers (Otsuka Electronics), 12-inch diameter integrating spheres (Gamma Scientific, GS0IS12-TLS), calibration light source (Gamma Scientific, GS-IS12-OP1) configured for total flux measurement, and excitation light source (Cree blue-LED chip, dominant wavelength 455 nm, C455EZ1000-S2001).

A blue LED with peak wavelength of 455 nm was then placed at the central position of the integrating sphere and was operated with a drive current of 25 mA. First the radiation power from the bare blue LED chip was acquired. The light emitting face distance of LED chip was 1 mm. A diced 2 mm×2 mm sample was coated with paraffin oil having similar refractive index as common encapsulation resin such as epoxy (for example about 1.75) was then mounted a distance of about 100 μm from LED chip. The radiation power of the combination of the sample and the blue LED was then acquired.

The results are provided in Table 1 below and show that adding co-dopant increases both the CRI and R9 of the emitted light. Compositions of the co-doped phosphor exhibited about a 10% increase over composition without the co-dopant.

| Powder Composition | CRI | R9 |
|---|---|---|
| Pure YAG | 71.0 | −32.2 |
| YAG + LuI | 75.4 | 21.9 |
| YAG + LuI w/1.5% Pr | 75.6 | 24.0 |

What is claimed is:

1. A lighting apparatus comprising:
    a light source configured to emit radiation having a wavelength of peak emission between about 360 nm and about 500 nm;
    a first phosphor configured to receive at least a portion of the radiation emitted by the light source, wherein the first phosphor has a first wavelength of peak emission between about 495 nm and about 600 nm; and
    a second phosphor configured to receive at least a portion of the radiation emitted by the light source, wherein the second phosphor is represented by the formula $RE_{2-x-y}CaMg_2Si_3O_{12}:Ce_x,A_y$, wherein:
    RE is a rare earth metal element selected from the group consisting of Lu, Y, Sc and Tb;
    A is a co-dopant selected from the group consisting of Pr, Cr, Mn and Tb;
    x is greater than 0 and less than about 1.0; and
    y is greater than 0 and less than about 0.2.

2. The lighting apparatus of claim 1, wherein the co-dopant increases the R9 value of light emitted by the lighting apparatus.

3. The lighting apparatus of claim 1, wherein the wavelength of peak emission of the light source is between about 450 nm and about 500 nm.

4. The lighting apparatus of claim 1, wherein the first wavelength of peak emission is between about 495 nm and about 560 nm.

5. The lighting apparatus of claim 1, wherein the first wavelength of peak emission is between about 560 nm and about 590 nm.

6. The lighting apparatus of claim 1, wherein the second phosphor has two emission peaks at (1) a second wavelength of peak emission between about 575 nm and about 680 nm and (2) a third wavelength of peak emission between about 600 nm and about 900 nm.

7. The lighting apparatus of claim 6, wherein the second wavelength of peak emission and the third wavelength of peak emission are substantially different.

8. The lighting apparatus of claim 6, wherein the second wavelength has a full width at half maximum of at least 60 nm.

9. The lighting apparatus of claim 6, wherein the third wavelength has a full width at half maximum of no more than 40 nm.

10. The lighting apparatus of claim 1, wherein the first phosphor and the second phosphor are luminescent powders.

11. The lighting apparatus of claim 1, wherein the first phosphor is disposed in a first emissive layer and the second phosphor is disposed in a second emissive layer.

12. The apparatus of claim 11, wherein the second emissive layer is disposed at least partially between the light source and the first emissive layer.

13. The lighting apparatus of claim 1, wherein the first phosphor comprises Y3-zAl5O12:Cez, wherein z is in the range of about 0.001 to about 0.30.

14. The lighting apparatus of claim 1, wherein the first phosphor comprises Lu.

15. The lighting apparatus of claim 1, wherein the first phosphor comprises $Lu_{3-z}Al_5O_{12}:Ce_z$, wherein z is in the range of about 0.001 to about 0.30.

16. The lighting apparatus of claim 1 wherein:
RE is Lu;
A is Pr;
x is in the range of about 0.002 to about 1.0; and
y is in the range of about 0.005 to about 0.20.

17. The lighting apparatus of claim 16, wherein x is about 0.12 and y is about 0.03.

18. The lighting apparatus of any one of claims 16, wherein the lighting apparatus has a color rendering index (CRI) of at least 70.

19. A method comprising exposing the phosphor composition of claim 1 to radiation having a wavelength of peak emission between about 360 nm to about 500 nm.

* * * * *